(12) United States Patent
Bonyak et al.

(10) Patent No.: US 10,736,207 B1
(45) Date of Patent: Aug. 4, 2020

(54) CANCELING MAGNETIC PICKUP USING THREE-DIMENSIONAL WIRING ASSEMBLY

(71) Applicant: BIOSENSE WEBSTER (ISRAEL) LTD., Yokneam (IL)

(72) Inventors: Yevgeny Bonyak, Haifa (IL); Michael Levin, Haifa (IL); Eyal Rotman, Hiriat Tivon (IL); Alek Vilensky, Netanya (IL)

(73) Assignee: Biosense Webster (Israel) Ltd., Yokneam (IL)

( * ) Notice: Subject to any disclaimer, the term of this patent is extended or adjusted under 35 U.S.C. 154(b) by 0 days.

(21) Appl. No.: 16/374,514

(22) Filed: Apr. 3, 2019

(51) Int. Cl.
| | |
|---|---|
| *H05K 1/02* | (2006.01) |
| *H05K 1/18* | (2006.01) |
| *H03F 3/45* | (2006.01) |
| *G01D 5/14* | (2006.01) |
| *H05K 3/46* | (2006.01) |

(52) U.S. Cl.
CPC ............ *H05K 1/0216* (2013.01); *G01D 5/14* (2013.01); *H03F 3/45475* (2013.01); *H05K 1/18* (2013.01); *H05K 3/46* (2013.01); *H05K 2201/09236* (2013.01); *H05K 2201/09245* (2013.01); *H05K 2201/10151* (2013.01)

(58) Field of Classification Search
CPC .......... H05K 1/0216; H05K 1/18; H05K 3/46; H05K 2201/09236; H05K 2201/09245; H05K 2201/10151; G01D 5/14; H03F 3/45475
See application file for complete search history.

(56) References Cited

U.S. PATENT DOCUMENTS

| | | | |
|---|---|---|---|
| 5,357,050 A * | 10/1994 | Baran | H05K 1/0228 174/261 |
| 5,371,469 A | 12/1994 | Anderson | |
| 5,389,735 A * | 2/1995 | Bockelman | H01P 3/081 174/261 |
| 5,391,199 A | 2/1995 | Ben-Haim | |
| 5,966,056 A * | 10/1999 | Thornton | H04L 5/20 174/32 |
| 6,239,724 B1 | 5/2001 | Doron et al. | |
| 6,332,089 B1 | 12/2001 | Acker et al. | |
| 6,484,118 B1 | 11/2002 | Govari | |
| 6,618,612 B1 | 9/2003 | Acker et al. | |

(Continued)

FOREIGN PATENT DOCUMENTS

WO   WO 96/05768   2/1996

OTHER PUBLICATIONS

U.S. Appl. No. 16/018,614, filed Jun. 26, 2018.

*Primary Examiner* — Hoa C Nguyen

(57) ABSTRACT

A wiring assembly includes a differential input port, a differential output port, and first and second pairs of electrical conductors. The differential input port is configured to receive a differential signal from a sensor at a first end of the wiring assembly. The differential output port is configured to output the differential signal at a second end of the wiring assembly. The first and second pairs of electrical conductors are laid out in a three-dimensional (3D) crossover configuration relative to one another and configured to conduct the differential signal from the first end to the second end, and to cancel pickup of a magnetic field by the wiring assembly. The electrical conductors of each pair are connected to one another at the first end and at the second end.

10 Claims, 3 Drawing Sheets

(56) References Cited

U.S. PATENT DOCUMENTS

| | | | |
|---|---|---|---|
| 6,690,963 B2 | | 2/2004 | Ben-Haim et al. |
| 7,232,959 B2 | * | 6/2007 | Hsu ................... H05K 1/0228 |
| | | | 174/113 R |
| 9,433,081 B1 | * | 8/2016 | Xiong ................. H04L 41/0803 |
| 2002/0065455 A1 | | 5/2002 | Ben-Haim et al. |
| 2003/0120150 A1 | | 6/2003 | Govari |
| 2004/0068178 A1 | | 4/2004 | Govari |
| 2005/0099240 A1 | * | 5/2005 | Lin ........................ H01P 3/02 |
| | | | 333/5 |
| 2007/0138626 A1 | * | 6/2007 | Knighten .......... H01L 23/49838 |
| | | | 257/713 |
| 2008/0171475 A1 | | 7/2008 | Antsos et al. |
| 2008/0266019 A1 | * | 10/2008 | Fusayasu ................ H04B 3/34 |
| | | | 333/12 |
| 2012/0299584 A1 | | 11/2012 | Kruusing |
| 2014/0113828 A1 | | 4/2014 | Gilbert et al. |
| 2015/0201864 A1 | * | 7/2015 | Govari .................. A61B 34/20 |
| | | | 600/409 |

* cited by examiner

CANCELING MAGNETIC PICKUP USING THREE-DIMENSIONAL WIRING ASSEMBLY

FIELD OF THE INVENTION

The present invention relates generally to noise and interference reduction in electronic systems, and particularly to methods and systems for reducing parasitic voltage induced in magnetic position tracking systems.

BACKGROUND OF THE INVENTION

Some electronic systems, such as magnetic position tracking systems, conduct electrical signals between an intrabody probe and a controller. The electrical signals are sometimes prone to parasitic voltage induced in the presence of magnetic fields. Various techniques may be used for improving the immunity of electronic systems to induced parasitic voltage.

For example, U.S. Pat. No. 5,371,469 describes a constant current loop measuring system for measuring a characteristic of an environment. The system comprises a first impedance positioned in the environment, a second impedance coupled in series with said first impedance and a parasitic impedance electrically coupled to the first and second impedances. A current generating device, electrically coupled in series with the first and second impedances, provides a constant current through the first and second impedances to produce first and second voltages across the first and second impedances, respectively, and a parasitic voltage across the parasitic impedance. A high impedance voltage measuring device measures a voltage difference between the first and second voltages independent of the parasitic voltage to produce a characteristic voltage representative of the characteristic of the environment.

U.S. Patent Application Publication 2014/0113828 describes electrical, mechanical, computing, and/or other devices that include components formed of extremely low resistance (ELR) materials, including, but not limited to, modified ELR materials, layered ELR materials, and new ELR materials.

SUMMARY OF THE INVENTION

An embodiment of the present invention that is described herein provides a wiring assembly including a differential input port, a differential output port, and first and second pairs of electrical conductors. The differential input port is configured to receive a differential signal from a sensor at a first end of the wiring assembly. The differential output port is configured to output the differential signal at a second end of the wiring assembly. The first and second pairs of electrical conductors are laid out in a three-dimensional (3D) crossover configuration relative to one another and configured to conduct the differential signal from the first end to the second end, and to cancel pickup of a magnetic field by the wiring assembly. The electrical conductors of each pair are connected to one another at the first end and at the second end.

In some embodiments, the first pair includes first and second electrical conductors and the second pair includes third and fourth electrical conductors. The wiring assembly includes four sections laid out along a longitudinal axis of the wiring assembly. The first electrical conductor is laid out at an upper right section, the second electrical conductor is laid out at a lower left section, the third electrical conductor is laid out at an upper left section, and the fourth electrical conductor is laid out at a lower right section. In other embodiments, the wiring assembly includes a circuit board (CB) having a substrate, a first layer disposed on a first side of the substrate and a second layer disposed on a second side of the substrate. The first and third electrical conductors include first and third electrical traces formed in parallel to one another in the first layer. The second and fourth electrical conductors include second and fourth electrical traces formed in parallel to one another in the second layer. The first and fourth electrical traces face one another across the substrate, and the second and third electrical traces face one another across the substrate.

In an embodiment, the wiring assembly includes a circuit board (CB) having a substrate, a first layer disposed on a first side of the substrate and a second layer disposed on a second side of the substrate. The electrical conductors of the first and second pairs include electrical traces formed in the CB. In another embodiment, the differential output port is configured to electrically connect to a differential amplifier, for amplifying the differential signal.

There is additionally provided, in accordance with an embodiment of the present invention, a method for producing a wiring assembly, the method includes providing a differential input port for receiving a differential signal from a sensor at a first end of the wiring assembly. A differential output port is provided for outputting the differential signal at a second end of the wiring assembly. First and second pairs of electrical conductors are laid out, between the first end and the second end, in a three-dimensional (3D) crossover configuration relative to one another, and each pair of the electrical conductors in connected to one another at the first end and at the second end. Each pair of the electrical conductors is coupled to the differential input port at the first end, and to the differential output port at the second end.

The present invention will be more fully understood from the following detailed description of the embodiments thereof, taken together with the drawings in which:

DETAILED DESCRIPTION OF EMBODIMENTS

Overview

Figure 1:
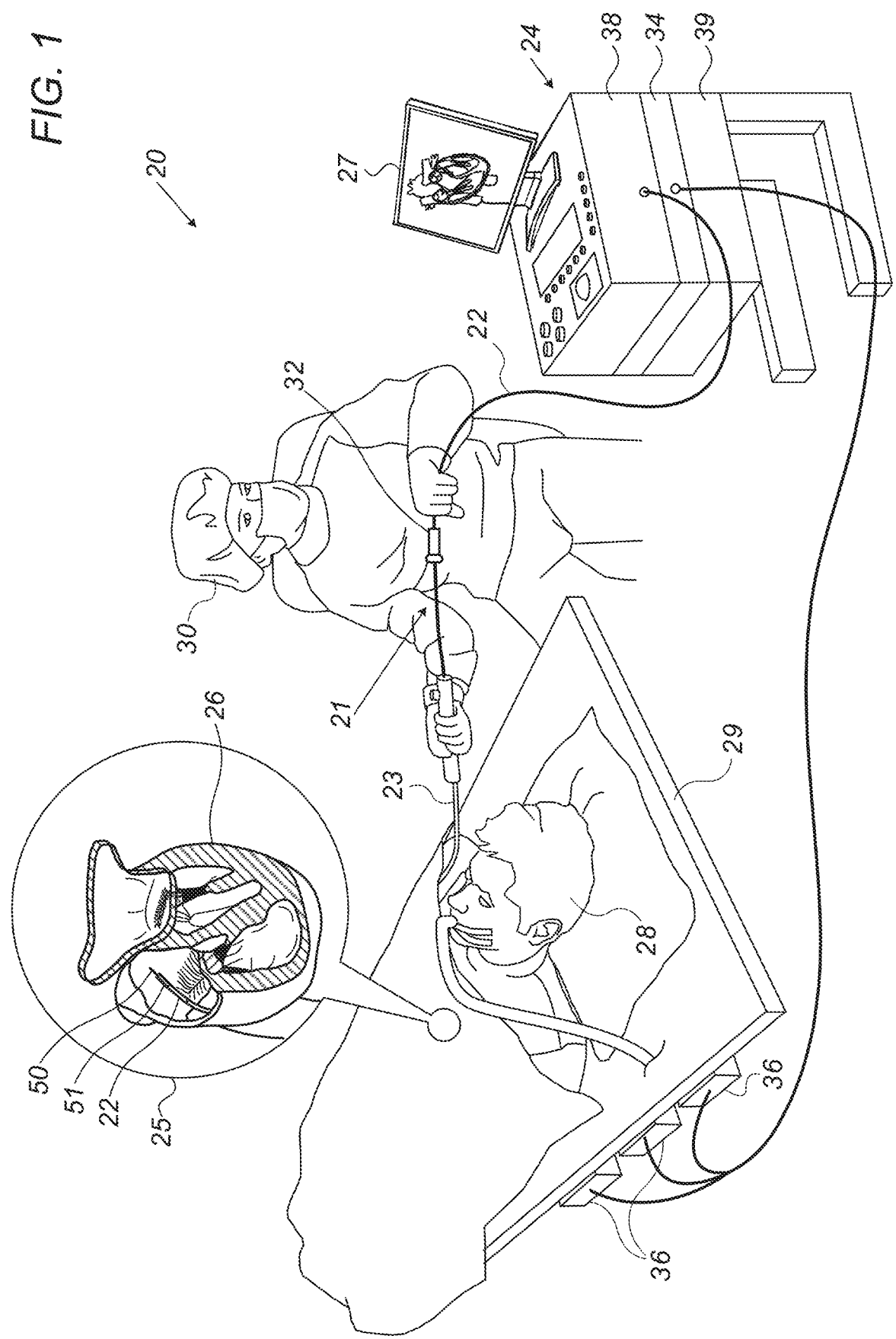
FIG. 1 is a schematic, pictorial illustration of a catheter-based magnetic position-tracking and ablation system, in accordance with an embodiment of the present invention.

Embodiments of the present invention that are described hereinbelow provide improved techniques for reducing parasitic voltage, which may be induced in a wiring assembly by an alternating magnetic field. Alternating magnetic fields are sometimes used in medical applications such as for tracking the position of a medical probe in an organ of the body.

In some embodiments, a magnetic position sensor is coupled to a distal end of a medical probe, and is configured to produce, in response to an alternating magnetic field of a position tracking system, a differential signal indicative of the position of the distal end in a patient body.

In some embodiments, the medical probe comprises a wiring assembly, which is configured to conduct the differential signal from the position sensor to a differential amplifier, coupled to the proximal end of the wiring assembly.

In some embodiments, the wiring assembly comprises a differential input port, configured to receive the differential signal at the distal end of the wiring assembly, and a differential output port, configured to output the differential signal to the amplifier.

In some embodiments, the wiring assembly further comprises a circuit board (CB) having two pairs of electrical traces configured to conduct the differential signal between the proximal and distal ends of the wiring assembly. The two pairs are patterned in a three-dimensional (3D) crossover configuration, relative to one another, along a longitudinal axis of the wiring assembly. The traces in each pair are electrically connected to one another both at the input port and the output port of the wiring assembly. The two pairs of traces are also referred to herein as a first pair and a second pair.

In an example embodiment, the first pair comprises first and second traces, and the second pair comprises third and fourth traces. In the 3D crossover configuration, the first and second traces of the first pair are laid out at the upper left and lower right sides of the CB, respectively, and the third and fourth traces of the second pair are laid out at the upper right and lower left sides of the CB, respectively.

In this configuration, the first and second traces are interconnected, at each of the input and output ports, in a first diagonal connection between the upper left and lower right sides of the CB. Similarly, the third and fourth traces are interconnected, at each port, in a second diagonal between the upper right and lower left sides of the CB. Note that even though the first and second diagonals are spatially crossing one another, the traces along the diagonals are electrically disconnected.

In some embodiments, the configuration of the diagonal connections, as described above, is implemented at the input and output ports of the wiring assembly. In this configuration, the first and second pairs form first and second respective electrically conductive loops having a similar cross-sectional area. Therefore, an approximately equal magnetic flux (produced by the alternating magnetic field of the position tracking system) traverses the first and second loops. The two loops, however, have opposite orientations (i.e., one has a clockwise orientation and the other has a counter-clockwise orientation). Therefore, the parasitic voltages induced in the two loops by the alternating magnetic field (referred to as first and second parasitic voltages, or first and second magnetic pickups) have similar absolute values but opposite polarities. The first and second parasitic voltages are therefore canceled out or at least reduced significantly at the output port of the wiring assembly.

The disclosed techniques may be used for canceling undesired noise, induced by external magnetic fields in signals received from various types of sensors coupled to a distal end of a medical probe. Moreover, the disclosed techniques may be implemented in any electronic system, e.g., in a magnetic resonance imaging (MRI) system, for protecting electrical signals against interference induced by external magnetic fields.

System Description

FIG. 1 is a schematic, pictorial illustration of a catheter-based magnetic position-tracking and ablation system 20, in accordance with an embodiment of the present invention.

System 20 comprises a catheter 21, having a shaft distal end 22 that is navigated by a physician 30 into a heart 26 of a patient 28 via the vascular system. In some embodiments, physician 30 inserts shaft distal end 22 through a sheath 23, while manipulating distal end 22 using a manipulator 32 located at the proximal end of catheter 21.

Reference is now made to an inset 25. In some embodiments, system 20 comprises a magnetic sensor 51, also referred to herein as a magnetic position tracking sensor or sensor 51 for brevity, and an ablation catheter 50, which are coupled to distal end 22.

In the embodiments, catheter 21 may be used for various procedures, such as electrophysiological (EP) mapping of heart 26 and for ablating selected tissue of heart 26.

In some embodiments, the proximal end of catheter 21 is electrically connected to a control console 24 via electrical leads and/or traces. In an embodiment, console 24 comprises a processor 39 and interface circuits 38, which is configured to exchange signals between processor 39 and various components and assemblies of system 20.

In some embodiments, interface circuits 38 are configured to receive electrical signals from catheter 21 and other sensors of system 20. Circuits 38 are further configured to send electrical signals from processor 38 to various components and assemblies of system 20, such as applying power via catheter 21 for ablating tissue of heart 26, and for controlling the other components and assemblies of system 20.

In some embodiments, system 20 comprises multiple (e.g., three) magnetic field generators 36, configured to produce alternating magnetic fields. Field generators 36 are placed at known positions external to patient 28, for example, below a patient table 29.

In some embodiments, console 24 further comprises a driver circuit 34, which is configured to drive magnetic field generators 36, and a display 27.

During a medical procedure physician 30 navigates distal end 22 of catheter 21 in heart 26 In some embodiments, in response to the magnetic fields irradiated from field generators 36, magnetic sensor 51 is configured to produce a differential electrical signal, also referred to herein as a differential signal or a position signal, indicative of the position of distal end 22 in heart 26.

In some embodiments, based on the differential signal received from sensor 51, processor 39 is configured to display, e.g., on display 27, the position of distal end 22 in the coordinate system of system 20.

This method of position sensing is implemented, for example, in the CARTO™ system, produced by Biosense Webster Inc. (Irvine, Calif.) and is described in detail in U.S. Pat. Nos. 5,391,199, 6,690,963, 6,484,118, 6,239,724, 6,618,612 and 6,332,089, in PCT Patent Publication WO 96/05768, and in U.S. Patent Application Publications 2002/0065455 A1, 2003/0120150 A1 and 2004/0068178 A1, whose disclosures are all incorporated herein by reference.

Processor 39 typically comprises a general-purpose processor, which is programmed in software to carry out the functions described herein. The software may be downloaded to the computer in electronic form, over a network, for example, or it may, alternatively or additionally, be provided and/or stored on non-transitory tangible media, such as magnetic, optical, or electronic memory.

Magnetic Pickup Cancellation Using a Wiring Assembly Having Multiple Traces

Figure 2:
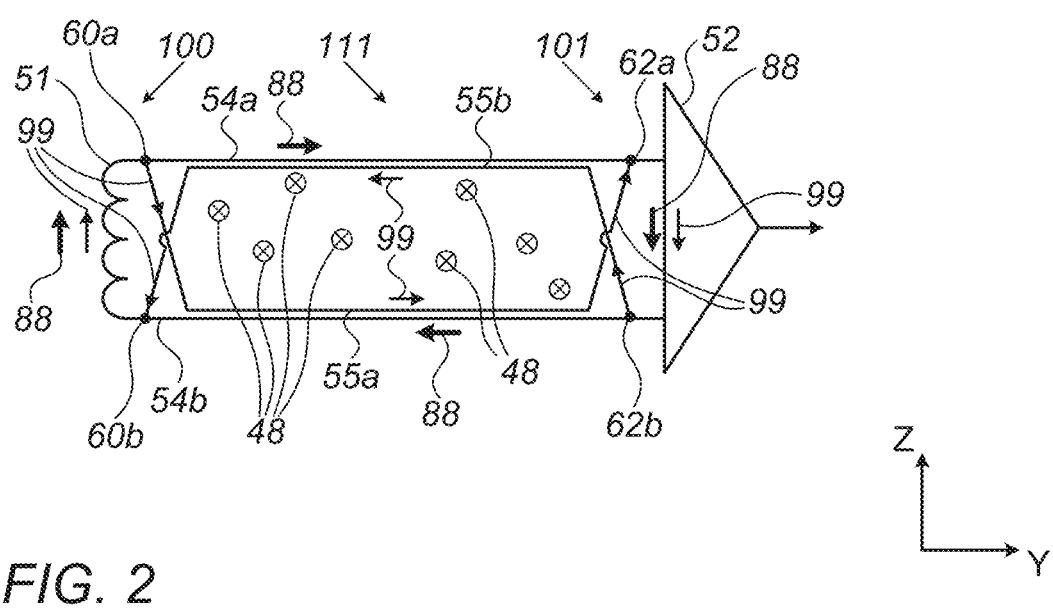
FIG. 2 is a schematic block diagram of a wiring assembly for canceling magnetic pickup noise, in accordance with an embodiment of the present invention.

FIG. 2 is a schematic block diagram of a wiring assembly 111 of catheter 21, in accordance with an embodiment of the present invention. In some embodiments, wiring assembly 111 may be implemented in catheter 21 for conducting the aforementioned differential signal between sensor 51 and console 24, via electrical readout circuitry such as a differential amplifier, referred to herein as an amplifier 52.

In some embodiments, wiring assembly 111 comprises a differential input port 100, which is configured to receive the differential signal from sensor 51, positioned at the distal end of wiring assembly 111. In some embodiments, wiring assembly 111 further comprises a differential output port 101, which is configured to output the differential signal received from input port 100, to amplifier 52, positioned at the proximal end of wiring assembly 111.

In some embodiments, amplifier 52 may be fitted at any suitable position along catheter 21. For example, amplifier 52 may be fitted in manipulator 32 held by physician 30, or in console 24 coupled to the proximal end of catheter 21.

In some embodiments, input port 100 comprises input points 60a and 60b, which are coupled to respective ends of a coil of sensor 51. Output port 101 comprises output points 62a and 62b, which are coupled to respective inputs of differential amplifier 52.

In some embodiments, wiring assembly 111 comprises a first differential pair of electrical conductors, in the present example electrical traces 54a and 54b, which are electrically connected between ports 100 and 101. In the example configuration of FIG. 2, trace 54a is electrically connected between input point 60a and output point 62a, and trace 54b is electrically connected between input point 60b and output point 62b.

In some embodiments, traces 54a and 54b are configured to conduct the aforementioned differential signal from sensor 51, via ports 100 and 101, to amplifier 52. As described in FIG. 1 above, field generators 36 produce one or more alternating magnetic fields in the body of patient 28, shown as field lines 48 traversing wiring assembly 111.

When wiring assembly 111 conducts the differential signal, the magnetic fields may induce a first parasitic voltage in a clockwise (CW) loop, shown by arrows 88. Note that the value of the induced first parasitic voltage depends, inter-alia, on the magnitude and direction of the magnetic field traversing the loop, and has a predefined polarity (e.g., positive) in the CW loop. The first parasitic voltage may distort the differential signal at the inputs of amplifier 52, and therefore, may reduce the accuracy and overall performance of the magnetic position-tracking system.

In the context of the present invention, and in the claims, the terms "magnetic pickup," "magnetic field pickup," "magnetic noise pickup" and "parasitic voltage" are used interchangeably and refer to undesired voltage induced by the magnetic field traversing wiring assembly 111 at any direction not parallel to a Y-Z plane of FIG. 2. As described above, the parasitic voltage may interfere with the differential signal produced by sensor 51 and, therefore, may reduce the position tracking performance of system 20.

In some embodiments, wiring assembly 111 further comprises a second pair of electrical conductors, in the present example electrical traces 55a and 55b, also configured to conduct the differential signal between ports 100 and 101. In some embodiments, trace 55a is electrically connected between input point 60a and output point 62a, and trace 55b is electrically connected between input point 60b and output point 62b.

In some embodiments, traces 54a and 55a are electrically connected to one another at input port 60a and at output port 62a. Similarly, trace 54b and 55b are electrically connected to one another at input point 60b and at output port 62b.

In some embodiments, when conducting the differential signal, field lines 48 may induce in wiring assembly 111 a second parasitic voltage having a negative polarity in a counterclockwise (CCW) loop, shown by arrows 99. In an embodiment, wiring assembly 111 is designed such that the areas within the CW and CCW loops are substantially similar. As a result, the first and second parasitic voltages may have substantially similar absolute values but opposite polarities. Therefore, in this configuration, the first and second parasitic voltages cancel one another.

Thus, when conducting the differential signal between sensor 51 and amplifier 52 in the presence of traversing magnetic fields, wiring assembly 111 is configured to cancel out the induced parasitic voltage.

In this embodiment, when wiring assembly 111 conducts the differential signal between sensor 51 and amplifier 52, the first and second parasitic voltages cancel one another, thus reducing the interference on the differential signal produced by sensor 51.

For example, sensor 51 may produce a suitable differential signal between tens of microvolts and tens of millivolts. In response to an alternating magnetic field, for example, between an order of micro-Henry and an order of Henry, the first and second loops may induce respective magnetic pickups between tens of microvolts and tens of millivolts.

In other embodiments, the first and second pairs described above, may comprise any other suitable type of electrical conductors, such as wires or leads. The configuration of a wiring assembly is also described, for example, in U.S. patent application Ser. No. 16/018,614, which is assigned to the assignee of the present patent application and whose disclosure is incorporated herein by reference.

This particular configuration of wiring assembly 111 is shown by way of example, in order to illustrate certain problems, such as induced parasitic voltage addressed by embodiments of the present invention, and to demonstrate the application of these embodiments in enhancing the performance of system 20. Embodiments of the present invention, however, are by no means limited to this specific sort of example configuration, and the principles described herein may similarly be applied to other sorts of wiring assemblies so as to cancel out magnetic pickup in other sorts of electronic systems operating in the presence of various types of traversing external fields.

Canceling Magnetic Pickup Using a 3D Wiring Assembly

Figure 3:
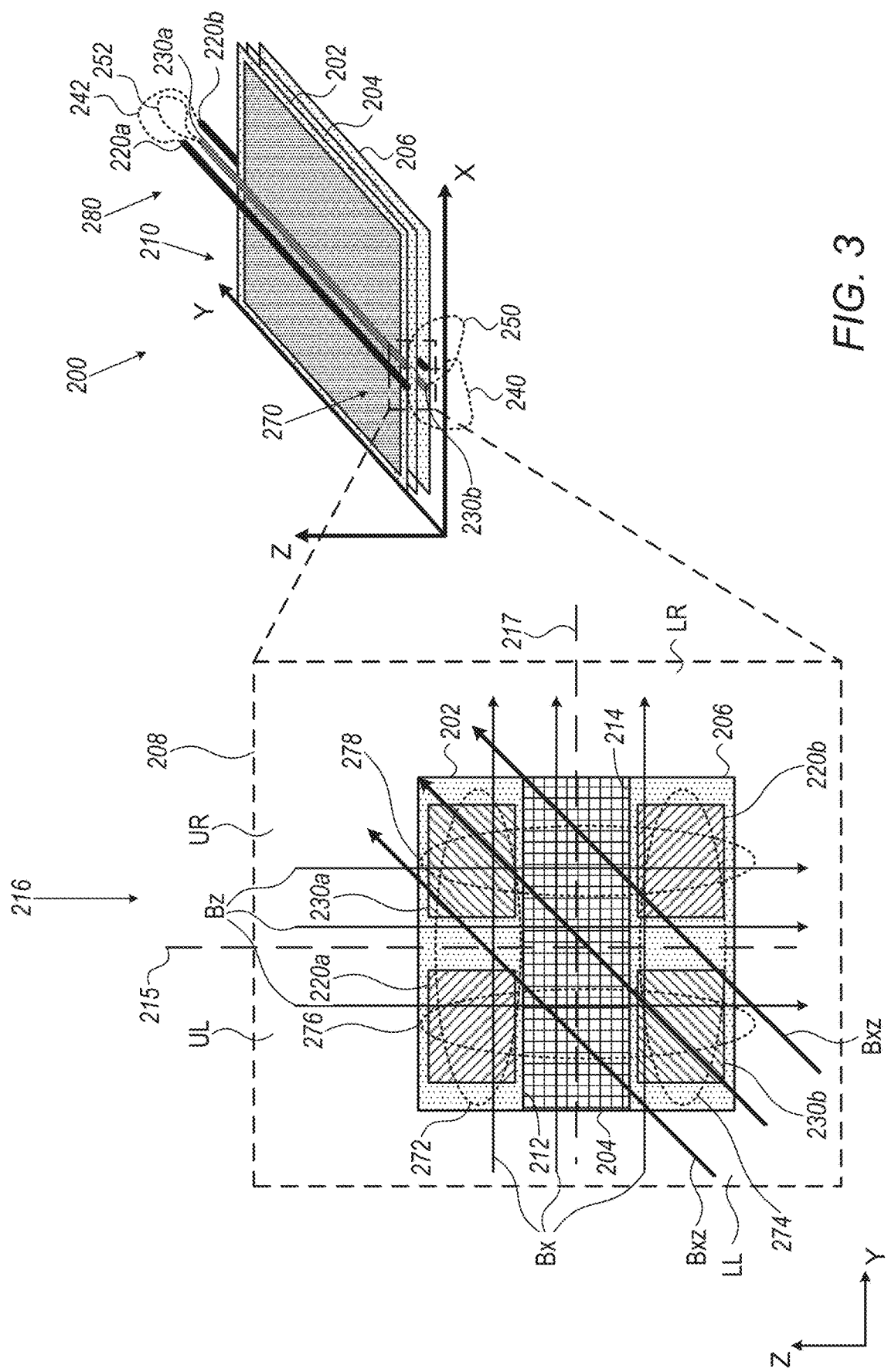
FIG. 3 is a schematic, pictorial illustration of a three-dimensional (3D) wiring assembly for canceling magnetic pickup noise, in accordance with an embodiment of the present invention.

FIG. 3 is a schematic, pictorial illustration of a wiring assembly 200, in accordance with an embodiment of the present invention. In some embodiments, wiring assembly 200 implements a three-dimensional (3D) configuration version of wiring assembly 111 of FIG. 2 above.

In some embodiments, wiring assembly 200 may be integrated in catheter 21 so as to cancel out magnetic pickup noise, induced by the magnetic fields as described above, when catheter 21 conducts the aforementioned differential signals between sensor 51 and amplifier 52. Additionally or alternatively, wiring assembly 200 is configured to conduct electrical signals between any other components of system 20 that may be affected by an external magnetic field.

In some embodiments, wiring assembly 200 comprises a circuit board (CB) 210, laid out without loss of generality in an x-y plane of the xyz coordinate system of FIG. 3.

In some embodiments, CB 210 comprises a substrate 204, typically made from multi-layered epoxy, reinforced by pre-impregnated ("prepreg") weave of glass fibers, or from any other suitable materials.

Reference is now made to an inset 208, which is a sectional view 216 of wiring assembly 200 in an X-Z plane of the XYZ coordinate system.

For the sake of conceptual clarity, sectional view 216 of wiring assembly 200, as well as inset 208 are divided into four virtual sections along the Y-axis, which is the longitudinal axis of wiring assembly 200. The four virtual sections comprise an upper left (UL) section, an upper right (UR) section, a lower left (LL) section, and a lower right (LR) section. The four sections are separated from one another by dashed lines 215 and 217, and each section is confined within the frame of inset 208. In the example of FIG. 3, all sections have a similar area, but in other embodiments, at least one of the sections may have a different area.

In some embodiments, CB 210 comprises any suitable polymer-based layers 202 and 206, each of which is made from one or more sub-layers, formed, respectively, on an upper surface 212 and a lower surface 214 of substrate 204. Note that substrate 204 and layers 202 and 206 are electrically insulating.

Reference is made again to an isometric view of wiring assembly 200 shown in FIG. 3. In some embodiments, wiring assembly 200 comprises two pairs of electrical conductors, laid out along Y axis. The first pair comprises electrical traces 220a and 220b, and the second pair comprises electrical traces 230a and 230b.

In some embodiments, the first and second pairs of electrical traces are laid out in a three-dimensional (3D) crossover configuration relative to one another. In this configuration, the traces of each pair are laid out in the diagonal sections of inset 208.

For example, electrical traces 220a and 220b are laid out, respectively, in the UL and LR sections of inset 208, which are diagonal to one another. Similarly, electrical traces 230a and 230b are laid out, respectively, in the UR and LL sections of inset 208, which are also diagonal to one another. Therefore, the two pairs of electrical conductors are laid out in the 3D crossover configuration relative to one another.

In some embodiments, the electrical traces are patterned in layers 202 and 206, and therefore, are electrically insulated from one another by substrate 204 and layers 202 and 206.

In some embodiments, electrical traces 220a and 230a of the first and second respective pairs, are disposed in layer 202, and electrical traces 220b and 230b of the first and second respective pairs, are disposed in layer 206.

In some embodiments, adjacent electrical traces along X-axis or Z-axis are positioned within a predefined distance from one another. For example, a first, substantially similar, distance between traces 220a and 230b and between traces 230a and 220b. Similarly, a second, substantially similar, distance between traces 220a and 230a and between traces 220b and 230b. In an embodiment, the first and second distances are substantially similar to one another. In other words, adjacent electrical traces along X-axis and Z-axis are positioned within a similar distance from one another.

In some embodiments, when implemented in catheter 21, traces 220a, 220b, 230a and 230b of wiring assembly 200 are electrically coupled to sensor 51 (not shown) at a distal end 280 and to amplifier 52 (not shown) at a proximal end 270, using any suitable input and output ports, such as input port 100 and output port 101 depicted in FIG. 2 above.

Reference is made again to inset 208. When applying the differential signal to traces 220a, 220b, 230a and 230b, and the aforementioned alternating magnetic fields produced by field generators 36, wiring assembly 200 has multiple loops similar to the CW and CCW loops described in in FIG. 2 above.

As shown in sectional view 216 of inset 208, alternating magnetic fields, referred to herein as Bx and Bz, are applied to wiring assembly 200 in X-axis and Z-axis, respectively. Note that Bx and Bz are provided by way of example for the sake of clarity. In EP procedures, however, the direction of the actual alternating magnetic field depends, inter-alia, on the configuration of field generators 36 and the orientation of distal end 22. Therefore, the direction of the actual alternating magnetic field applied to wiring assembly 200 may be any combination of Bx and Bz, referred to herein as Bxz and also shown in inset 208.

In some embodiments, the configuration of wiring assembly 200 forms, in response to the differential signal and magnetic fields, a first pair of loops 272 and 274 along Z-axis, and a second pair of loops 276 and 278 along X-axis. Note that the field lines of alternating magnetic field Bz are traversing both loops 272 and 274. In this configuration, loops 272 and 274 correspond, respectively, to the CW and CCW loops depicted in FIG. 2 above. In other words, when conducting the differential signal produced by sensor 51, in response to alternating magnetic field Bz, loops 272 and 274 produce parasitic voltages having similar absolute values but opposite polarities.

In these embodiments, based on loops 272 and 274, wiring assembly 200 is configured to cancel out the parasitic voltage induced in response to alternating magnetic field Bz.

Similarly, field lines of alternating magnetic field Bx are traversing both loops 276 and 278. In this configuration, loops 276 and 278 correspond, respectively, to the CW and CCW loops of FIG. 2 above. In some embodiments, based on loops 276 and 278, wiring assembly 200 is configured to cancel out the parasitic voltage induced in response to alternating magnetic field Bx.

Moreover, as described above, a combination of the CW and CCW loops is configured to cancel out any combination of magnetic fields. Therefore, in accordance with the embodiments described above, loops 272, 274, 276 and 276 are further configured to cancel out any parasitic voltage induce in response to alternating magnetic field Bxz or any other alternating magnetic field formed as a combination of Bx and Bz.

Reference is made again to the isometric view of FIG. 3. In some embodiments, wiring assembly 200 comprises electrical conductors, such as leads 240 and 242 positioned at proximal end 270 and distal end 280, respectively. Leads 240 and 242 are electrically connecting between electrical traces 220a and 220b of the first pair. Wiring assembly 200 comprises additional electrical conductors, such as leads 250 and 252, electrically connecting between electrical traces 230a and 230b of the second pair, at proximal end 270 and distal end 280, respectively.

In some embodiments, leads 240 and 250 may be connected to amplifier 52, and leads 242 and 252 may be connected to sensor 51, both shown in FIG. 2 above. For evaluating the performance of wiring assembly 200 in canceling magnetic pickup, the inventors made provisional connections by leads 240, 242, 250 and 252, and applied the aforementioned differential signal and alternating magnetic fields, such as Bx and Bz, to wiring assembly 200. In one such experiment a reduction of 20 dB in the noise level was measured.

In these performance evaluation embodiments, leads 240, 242, 250 and 252 have been used only for testing, and are therefore shown as dashed lines in the isometric view of wiring assembly 200, shown in FIG. 3.

In other embodiments, the traces of wiring assembly 200 may be arranged in a different configuration so as to cancel out parasitic voltage caused by alternating magnetic fields in selected directions. For example, trace 220b of the first pair may be disposed instead of trace 230a of the second pair, and vice-versa. In other words, traces 220a and 220b are disposed in layer 202 and traces 230a and 230b are disposed in layer 206.

In this configuration, the wiring assembly may have two diagonal loops, and therefore is configured to cancel out parasitic voltage induced by alternating magnetic field Bz, whereas the parasitic voltage induced by alternating magnetic field Bx will not be canceled.

In another example configuration, traces 220a and 220b are disposed, respectively, in the UR and LR sections of wiring assembly 200, and traces 230a and 230b are disposed, respectively, in the UL and LL sections of wiring assembly 200.

In this configuration, wiring assembly 200 may have two diagonal loops, and therefore is configured to cancel out parasitic voltage induced by alternating magnetic field Bx, whereas the parasitic voltage induced by alternating magnetic field Bz will not be canceled.

The particular configuration of wiring assembly 200 is shown by way of example, in order to illustrate certain problems that are addressed by embodiments of the present invention and to demonstrate the application of these embodiments in enhancing the performance of the magnetic position tracking system comprised in system 20. Embodiments of the present invention, however, are by no means limited to this specific sort of example wiring assembly and magnetic position tracking system, and the principles described herein may similarly be applied to other sorts of electronic systems operating under external alternating magnetic and/or electrical fields.

Although the embodiments described herein mainly address magnetic position tracking systems used in minimally-invasive medical application, the methods and systems described herein can also be used in other applications, such as in any transmission of low amplitude differential signal affected by external magnetic fields.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A wiring assembly, comprising:
   a differential input port, configured to receive a differential signal from a sensor at a first end of the wiring assembly;
   a differential output port, configured to output the differential signal at a second end of the wiring assembly; and
   first and second pairs of electrical conductors, laid out in a three-dimensional (3D) crossover configuration relative to one another and configured to conduct the differential signal from the first end to the second end, and to cancel pickup of a magnetic field by the wiring assembly, wherein the electrical conductors of each pair are connected to one another at the first end and at the second end, the first and second pairs of electrical conductors form electrically conductive loops having substantially the same cross-sectional areas and arranged such that parasitic voltages induced in the two loops are equal in value but of opposite polarity.

2. The wiring assembly according to claim 1, wherein the first pair comprises first and second electrical conductors and the second pair comprises third and fourth electrical conductors, wherein the wiring assembly comprises four sections laid out along a longitudinal axis of the wiring assembly, and wherein the first electrical conductor is laid out at an upper right section, the second electrical conductor is laid out at a lower left section, the third electrical conductor is laid out at an upper left section, and the fourth electrical conductor is laid out at a lower right section.

3. The wiring assembly according to claim 2, and comprising a circuit board (CB) having a substrate, a first layer disposed on a first side of the substrate and a second layer disposed on a second side of the substrate,
   wherein the first and third electrical conductors comprise first and third electrical traces formed in parallel to one another in the first layer,
   wherein the second and fourth electrical conductors comprise second and fourth electrical traces formed in parallel to one another in the second layer,
   and wherein the first and fourth electrical traces face one another across the substrate, and the second and third electrical traces face one another across the substrate.

4. The wiring assembly according to claim 1, and comprising a circuit board (CB) having a substrate, a first layer disposed on a first side of the substrate and a second layer disposed on a second side of the substrate, wherein the electrical conductors of the first and second pairs comprise electrical traces formed in the CB.

5. The wiring assembly according to claim 1, wherein the differential output port is configured to electrically connect to a differential amplifier, for amplifying the differential signal.

6. A method for producing a wiring assembly, the method comprising:
   providing a differential input port, for receiving a differential signal from a sensor at a first end of the wiring assembly;
   providing a differential output port, for outputting the differential signal at a second end of the wiring assembly;
   laying out, between the first end and the second end, first and second pairs of electrical conductors in a three-dimensional (3D) crossover configuration relative to one another, and connecting each pair of the electrical conductors to one another at the first end and at the second end; and
   coupling each pair of the electrical conductors to the differential input port at the first end, and to the differential output port at the second end, wherein the first and second pairs of electrical conductors form electrically conductive loops having substantially the same cross-sectional areas and arranged such that parasitic voltages induced in the two loops are equal in value but of opposite polarity.

7. The method according to claim 6, wherein the first pair comprises first and second electrical conductors and the second pair comprises third and fourth electrical conductors, wherein the wiring assembly comprises four sections laid out along a longitudinal axis of the wiring assembly, and wherein laying out the first and second pairs comprises, laying out: (a) the first electrical conductor at an upper right section, (b) the second electrical conductor at a lower left section, (c) the third electrical conductor at an upper left section, and (d) the fourth electrical conductor at a lower right section.

8. The method according to claim 7, and comprising providing a circuit board (CB) having a substrate, disposing a first layer on a first side of the substrate and disposing a second layer on a second side of the substrate, wherein laying out the first and third electrical conductors comprise forming first and third electrical traces in parallel to one another in the first layer,
wherein laying out the second and fourth electrical conductors comprise forming second and fourth electrical traces in parallel to one another in the second layer,
and wherein the first and fourth electrical traces face one another across the substrate, and the second and third electrical traces face one another across the substrate.

9. The method according to claim 6, and comprising providing a circuit board (CB) having a substrate, disposing a first layer on a first side of the substrate and disposing a second layer on a second side of the substrate, wherein laying out the electrical conductors of the first and second pairs comprises forming electrical traces in the CB.

10. The method according to claim 6, and comprising electrically connecting the differential output port to a differential amplifier for amplifying the differential signal.

* * * * *